United States Patent
Takahashi

(10) Patent No.: US 7,563,349 B2
(45) Date of Patent: Jul. 21, 2009

(54) SPUTTERING DEVICE

(75) Inventor: Nobuyuki Takahashi, Sagamihara (JP)

(73) Assignee: CYG Corporation, Kanagawa (JP)

( * ) Notice: Subject to any disclaimer, the term of this patent is extended or adjusted under 35 U.S.C. 154(b) by 544 days.

(21) Appl. No.: 11/248,257

(22) Filed: Oct. 13, 2005

(65) Prior Publication Data

US 2006/0081463 A1    Apr. 20, 2006

(30) Foreign Application Priority Data

Oct. 15, 2004    (JP) .............................. 2004-300845

(51) Int. Cl.
*C23C 14/00* (2006.01)
*C25B 11/00* (2006.01)
*C25B 13/00* (2006.01)

(52) U.S. Cl. .............................. 204/298.28; 204/298.2; 204/298.22; 204/298.23; 204/298.27

(58) Field of Classification Search ................. 118/726; 204/192.11, 192.12, 298.26; 219/121.6; 427/509

See application file for complete search history.

(56) References Cited

U.S. PATENT DOCUMENTS

| | | | | |
|---|---|---|---|---|
| 4,250,009 A | * | 2/1981 | Cuomo et al. | 204/192.11 |
| 4,604,294 A | * | 8/1986 | Tanaka et al. | 427/509 |
| 4,664,935 A | * | 5/1987 | Strahl | 204/192.1 |
| 4,756,810 A | * | 7/1988 | Lamont et al. | 204/192.3 |
| 5,114,556 A | * | 5/1992 | Lamont, Jr. | 204/192.12 |
| 5,308,461 A | * | 5/1994 | Ahonen | 204/192.11 |
| 5,468,930 A | * | 11/1995 | Nishikawa et al. | 219/121.6 |
| 5,622,567 A | * | 4/1997 | Kojima et al. | 118/726 |
| 6,110,291 A | * | 8/2000 | Haruta et al. | 118/726 |
| H1933 H | * | 1/2001 | Zabinski et al. | 204/298.26 |
| 6,190,511 B1 | * | 2/2001 | Wei | 204/192.11 |
| 6,461,484 B2 | * | 10/2002 | Yo et al. | 204/192.12 |
| 6,899,795 B1 | * | 5/2005 | Dubs et al. | 204/192.12 |
| 2002/0029959 A1 | * | 3/2002 | Yo et al. | 204/192.12 |

FOREIGN PATENT DOCUMENTS

| | | | |
|---|---|---|---|
| JP | 61159571 A | * | 7/1986 |
| JP | 62211375 A | * | 9/1987 |
| JP | 01219158 A | * | 9/1989 |
| JP | 04371577 A | * | 12/1992 |
| JP | 2002-20864 | | 1/2002 |
| JP | 2003247065 A | * | 9/2003 |

* cited by examiner

*Primary Examiner*—Alexa D Neckel
*Assistant Examiner*—Michael Band
(74) *Attorney, Agent, or Firm*—Wenderoth, Lind & Ponack, L.L.P.

(57) ABSTRACT

A sputtering device includes at least: a vacuum container defining a vacuum space; a substrate holder installed rotatably in the vacuum space; a substrate installed on the substrate holder; a target for forming thin film on the substrate; and a rotatable sputtering cathode in which the target is installed. The sputtering cathode is slanted relative to the substrate, and a center of the target is eccentric to a rotation axis of the sputtering cathode.

12 Claims, 1 Drawing Sheet

SPUTTERING DEVICE

BACKGROUND OF THE INVENTION

The present invention relates to a sputtering device which has a target for forming a thin film on a substrate and in which ionized gas is collided with the target in order to sputter atoms or molecules of the target and the atoms or the molecules are stuck on the substrate to form the thin film on the substrate.

In a sputtering device disclosed in JP 2002-20864 A, three plates with the same constitution for modifying distribution are arranged between three targets and a circular shaped substrate, a rotation center of a rotated substrate is offset from a center of the target at a specific distance and the substrate and the target are arranged so as to radiate sputtering particles obliquely to the substrate.

JP 2003-247065 A discloses a device for forming thin film in which particles of materials for forming film are sputtered from a plurality of sputtering sources by using ions of plasma flow in order to form thin film on the substrate. As the device generates plasma due to electronic cyclotron resonance discharge by a means for generating plasma, symmetrical rotation axes of the plural sputtering source targets are crossed on a rotation center axis of a sample substrate base and arranged so as to incline relative to the rotation center axis of the sample substrate base. Besides, the sample substrate base is provided with a rotation means for rotating slantly so that a crossing point of the symmetrical rotation axes of the targets and the rotation center axis of the sample substrate base is positioned in an opposite side of the target against a sample substrate for forming thin film, and a moving means for moving the sample substrate base up and down.

In the devices disclosed in the above JP 2002-20864 A and JP 2003-247065 A, though sputtering target materials must be set to specific positions in order to gain not more than ±3% of film evenness desired usually, a problem so that setting positions are different by kinds of the sputtering target materials is arisen. However, if a range between 1 to 3% of forming film distribution is desired, it is possible to gain available positions between the substrate and the sputtering target materials by repeating experimentation, but not more than 1% of the forming film distribution by increase of device functions is desired recently, so that response to the request becomes difficult. Besides, in the case that the forming film distribution desired in a market is achieved by setting available positions between the substrate and the target materials, change of the forming film distribution by using repeatedly can not be followed recently because the sputtering target materials are consumed.

SUMMARY OF THE INVENTION

An object of the invention is to provide a sputtering device which can provide stable forming film distribution.

Accordingly, the present invention is a sputtering device comprising at least: a vacuum container defining a vacuum space; a substrate holder installed rotatably in the vacuum space; a substrate installed on the substrate holder; a target for forming thin film on the substrate; and a rotatable sputtering cathode in which the target is installed, wherein the sputtering cathode is slanted relative to the substrate, and a center of the target is eccentric to a rotation axis of the sputtering cathode.

It is preferred that the sputtering cathode comprises at least a means for cooling provided behind the target, magnets for generating a magnetic field to the target and an earth shield arranged around the target, and is rotatable by a rotation means.

Furthermore, it is preferred that an extending line of the rotation axis of the sputtering cathode and an extending line of a rotation axis of the substrate holder cross at an approximate center position of the substrate.

Accordingly, the target which is arranged so as to be slanted relative to the substrate and rotated can be sputtered according to the present invention, so that the forming film distribution can be designed so as to be uniform.

Furthermore, because adhesion rate for forming film is increased, productivity can be increased.

DETAILED DESCRIPTION OF THE PREFERRED EMBODIMENT

Figure 1:
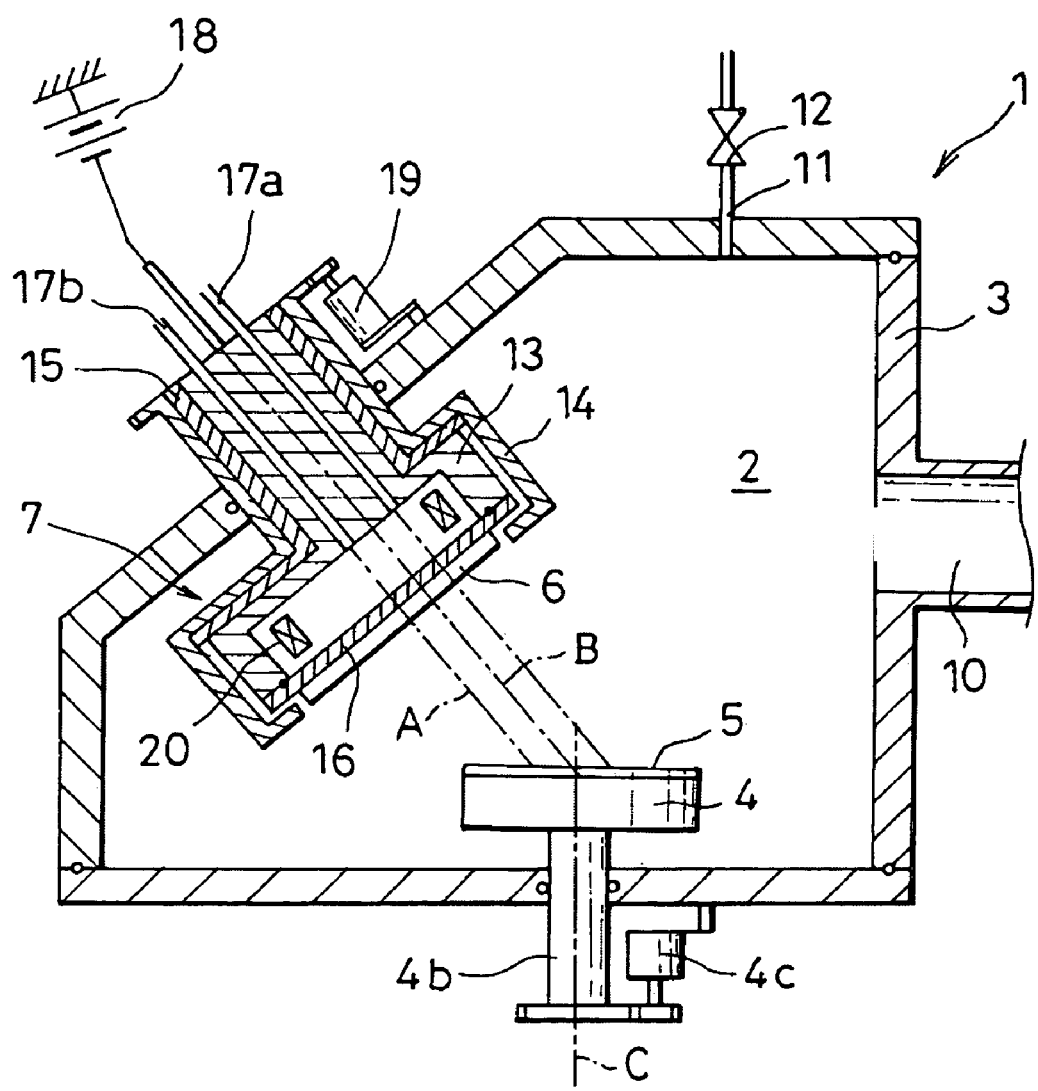
FIG. 1 is a schematic diagram of a sputtering device according to an embodiment of the present invention.

Hereinafter, a working mode of the present invention is explained by referring to a drawing.

A sputtering device 1 according to an embodiment of the present invention is, as shown in FIG. 1, constituted of at least a vacuum container 3 defining a vacuum space 2 inside thereof, a substrate 5 installed on a substrate holder 4 which is arranged in the vacuum space 2, a target 6 arranged so as to face the substrate 5, and a sputtering cathode 7 in which the target is installed.

A vacuum pump not shown in the FIGURE is connected to an exhaust vent 10 of the vacuum container 3, so that the vacuum space 2 is formed by exhausting air therefrom. Besides, a gas introducing vent 11 for supplying gas such as argon gas to the vacuum space 2 is provided in the vacuum container 3. The gas introducing vent 11 is suitably opened or closed by a valve 12.

The substrate holder 4 is supported in the vacuum space 2 by a rotation shaft 4b which is rotatably supported for rotation relative to the vacuum container 3, and rotated by an electric motor 4c.

The sputtering cathode 7 is arranged so as to be slanted at a specific angle to the substrate 5 and has a rotation axis B which is eccentric to a center axis A of the target 6. An electrode base 13 is provided around the rotation axis B. As shown in FIG. 1, the target 6 is perpendicular to the rotation axis B. An earth shield 14 is provided via an insulator 15 so as to surround the electrode base 13. Magnets 20 are arranged via vacuum sealing behind a base support 16 on which the target 6 is installed. Cooling water is supplied behind the base support 16 via a feed pipe 17a and a drain pipe 17b in order to prevent heat increase of the target 6. Besides, the electrode base 13 is connected to one terminal of a sputtering power source 18 and another terminal of the sputtering power source 18 is connected to the vacuum container 3. Note that the sputtering power source 18 is a DC source or a high frequency power source. Furthermore, the sputtering cathode 7 is rotated by a driving motor 19. Besides, the sputtering cathode 7 is arranged so that an extending line of the rotation axis B of the sputtering cathode 7 and an extending line of a rotation axis C of the substrate holder 4 cross at an approximate center of the substrate 5, and the center axis A of the target 6 rotates around the rotation axis B by rotation of the sputtering cathode 7.

According to the above mentioned constitution, the substrate 5 on which the thin film is to be formed is installed on the substrate holder 4, the vacuum space 2 is formed inside the vacuum container 3 by exhausting air, the substrate holder is rotated at a specific speed, gas for sputtering is introduced inside the vacuum space 2, high voltage is applied between the sputtering cathode 7 and the substrate 5, sputtering particles are sputtered from the target 6, and then the sputtering cathode is rotated at a specific speed relative to the substrate 5, so that the thin film is formed on the substrate 5.

Thus, since the target 6 is revolved relative to the target 5, an angle of incidence of the sputtering particles can be changed, so that good thin film distribution and coverage distribution can be achieved. Accordingly, because the best film forming distribution can always be achieved, it can contribute to stability in mass production.

What is claimed is:

1. A sputtering device comprising:
   a vacuum container defining a vacuum space;
   a substrate holder installed rotatably in said vacuum space for rotation about a first rotation axis;
   a substrate installed on said substrate holder;
   a rotatable sputtering cathode rotatably mounted in said vacuum container for rotation about a second rotation axis; and
   a sputtering target installed in said rotatable sputtering cathode for forming thin film on said substrate;
   wherein said sputtering target is disposed perpendicular to said second rotation axis;
   wherein a center of said sputtering target is eccentric to said second rotation axis; and
   wherein said rotatable sputtering cathode is disposed at a slant relative to said substrate such that said sputtering target is disposed at a slant relative to said substrate.

2. A sputtering device according to claim 1, wherein:
   said rotatable sputtering cathode comprises a cooling section which is provided behind said sputtering target, magnets for generating magnetic field to said sputtering target and an earth shield which is arranged around said sputtering target, and a rotation device is operably connected to said rotatable sputtering cathode to rotate said rotatable sputtering cathode about said second rotation axis.

3. A sputtering device according to claim 1, wherein:
   said rotatable sputtering cathode, said substrate holder and said substrate are arranged such that an extending line of said second rotation axis and an extending line of said first rotation axis cross at an approximate center position of said substrate.

4. A sputtering device according to claim 2, wherein:
   said rotatable sputtering cathode, said substrate holder and said substrate are arranged such that an extending line of said second rotation axis and an extending line of said first rotation axis cross at an approximate center position of said substrate.

5. A sputtering device comprising:
   a vacuum container defining a vacuum space;
   a substrate holder installed rotatably in said vacuum space for rotation about a first rotation axis;
   a substrate installed on said substrate holder;
   a rotatable sputtering cathode rotatably mounted in said vacuum container for rotation about a second rotation axis; and
   a sputtering target installed in said rotatable sputtering cathode for forming thin film on said substrate;
   wherein said sputtering target is disposed perpendicular to said second rotation axis such that a center of said sputtering target is eccentric to said second rotation axis, and
   wherein said rotatable sputtering cathode is disposed at a slant relative to said substrate such that said sputtering target is rotatable at a slant relative to said substrate.

6. A sputtering device according to claim 5, wherein:
   said rotatable sputtering cathode comprises a cooling section which is provided behind said sputtering target, magnets for generating magnetic field to said sputtering target and an earth shield which is arranged around said sputtering target, and a rotation device is operably connected to said rotatable sputtering cathode to rotate said rotatable sputtering cathode about said second rotation axis.

7. A sputtering device according to claim 5, wherein:
   said rotatable sputtering cathode, said substrate holder and said substrate are arranged such that an extending line of said second rotation axis and an extending line of said first rotation axis cross at an approximate center position of said substrate.

8. A sputtering device according to claim 6, wherein:
   said rotatable sputtering cathode, said substrate holder and said substrate are arranged such that an extending line of said second rotation axis and an extending line of said first rotation axis cross at an approximate center position of said substrate.

9. A sputtering device comprising:
   a vacuum container defining a vacuum space;
   a substrate holder installed rotatably in said vacuum space, said substrate holder being rotatable about a first rotation axis for rotating a substrate about said first rotation axis;
   a rotatable sputtering cathode rotatably mounted in said vacuum container, said rotatable sputtering cathode being rotatable about a second rotation axis for rotating a sputtering target about said second rotation axis such that a thin film is formed on the substrate; and
   wherein said rotatable sputtering cathode is operable to hold the sputtering target perpendicular to said second rotation axis and with a center of said sputtering target eccentric to said second rotation axis, and
   wherein said rotatable sputtering cathode is disposed at a slant relative to said substrate for holding said sputtering target at a slant relative to said substrate.

10. A sputtering device according to claim 9, wherein:
    said rotatable sputtering cathode comprises a cooling section which is provided behind said sputtering target, magnets for generating magnetic field to said sputtering target and an earth shield which is arranged around said sputtering target, and a rotation device is operably connected to said rotatable sputtering cathode to rotate said rotatable sputtering cathode about said second rotation axis.

11. A sputtering device according to claim 9, wherein:
    said rotatable sputtering cathode, said substrate holder and said substrate are arranged such that an extending line of said second rotation axis and an extending line of said first rotation axis cross at an approximate center position of said substrate.

12. A sputtering device according to claim 10, wherein:
    said rotatable sputtering cathode, said substrate holder and said substrate are arranged such that an extending line of said second rotation axis and an extending line of said first rotation axis cross at an approximate center position of said substrate.

* * * * *